US007012428B1

(12) United States Patent
Ward et al.

(10) Patent No.: US 7,012,428 B1
(45) Date of Patent: Mar. 14, 2006

(54) METHOD AND APPARATUS OF REDUCING ARTIFACTS IN PHASE-CYCLED STEADY-STATE FREE PRECESSION IMAGING

(75) Inventors: Heidi A. Ward, Rochester, MN (US); Bernice E. Hoppel, Delafield, WI (US)

(73) Assignee: General Electric Company, Schenectady, NY (US)

( * ) Notice: Subject to any disclaimer, the term of this patent is extended or adjusted under 35 U.S.C. 154(b) by 75 days.

(21) Appl. No.: 10/707,483

(22) Filed: Dec. 17, 2003

(51) Int. Cl.
  *G01V 3/00* (2006.01)
(52) U.S. Cl. ..................... 324/309
(58) Field of Classification Search ............ 324/307, 324/309
  See application file for complete search history.

(56) References Cited

U.S. PATENT DOCUMENTS

| | | | | |
|---|---|---|---|---|
| 5,055,790 A | * | 10/1991 | Siuciak et al. | ............ 324/309 |
| 5,912,557 A | | 6/1999 | Wilman et al. | |
| 6,144,874 A | * | 11/2000 | Du | ............ 600/413 |
| 6,167,293 A | * | 12/2000 | Chenevert et al. | .......... 600/420 |
| 6,201,393 B1 | | 3/2001 | Bernstein et al. | |
| 6,288,544 B1 | | 9/2001 | Bernstein et al. | |
| 6,603,992 B1 | * | 8/2003 | Debbins et al. | ............ 600/420 |
| 6,624,630 B1 | * | 9/2003 | Foxall | ........................ 324/307 |
| 6,677,750 B1 | * | 1/2004 | Hennig et al. | ............ 324/307 |

OTHER PUBLICATIONS

Casselman, J. et al., "Constructive Interference in Steady State-3DFT MR Imaging of the Inner Ear and Cerebellopontine Angle", AJNR, 1993, vol. 14, pp. 47-57.

Vasanawala, S. et al., "Linear Combination Steady-State Free Precession MRI", Magnetic Resource in Medicine, 2000, vol. 43, pp. 82-90.

Zur, Y. et al., "Motion-Insensitive, Steady-State Free Precession Imaging", Magnetic Resonance in Medicine, 1990, vol. 16, pp. 444-459.

Foxall, D., "Frequency-Modulated Steady-State Free Precession Imaging", Magnetic Resonance in Medicine, 2002, vol. 48, pp. 502-508.

* cited by examiner

Primary Examiner—Diego Gutierrez
Assistant Examiner—Dixomara Vargas
(74) Attorney, Agent, or Firm—Ziolkowski Patent Solutions Group, SC; Michael A. Della Penna; Carl B. Horton

(57) ABSTRACT

A method and apparatus of imaging multiple volumes of the anatomy of interest using a phase-cycled SSFP pulse sequence and a reverse elliptic centric view ordering to sample a first volume and an elliptic centric view ordering to sample a second volume is disclosed. Dummy acquisitions are played out between imaging of the first and second volumes, and the time to play out the dummy acquisitions is used to change the phase-cycling scheme of the RF pulses of the SSFP pulse sequence. Oscillations in signal are reduced as the spins in the anatomy of interest are brought to a new steady-state by gradually ramping the RF pulse phase increment for acquisition from the first volume to the RF pulse phase increment for acquisition from the second volume. The present invention is effective for reducing transient oscillations in MR signals from resonance and off-resonance spins, thus enabling the use of this technique for the reduction of motion artifacts in phase-cycled SSFP.

31 Claims, 3 Drawing Sheets

METHOD AND APPARATUS OF REDUCING ARTIFACTS IN PHASE-CYCLED STEADY-STATE FREE PRECESSION IMAGING

BACKGROUND OF INVENTION

The present invention relates generally to MR imaging and, more particularly, to a method and system of reducing artifacts in a phase-cycled steady-state free precession (SSFP) acquisition. Phase-cycled SSFP acquires data multiple times from a given anatomical region, wherein each volumetric acquisition is acquired with a different RF phase increment. Thus, multiple volumes of data of the same anatomical region are acquired. The present invention further relates to implementing a phase-cycled SSFP pulse sequence to acquire MR data for the first volume with a reverse elliptic centric view order and acquire MR data for the second volume with an elliptic centric view order. The present invention also relates to the playing out of a series of dummy acquisitions between imaging of the first and second volumes, and the gradual modulation of RF pulse phase increment while the dummy acquisitions are played out.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Phase-cycled SSFP imaging techniques are commonly used for high resolution imaging of structures such as the internal auditory canal, cervical spine or cartilage imaging, but also can be used for many other applications. SSFP is a technique for generating MR signals wherein hydrogen nuclei do not completely return to their thermal equilibrium state. SSFP pulse sequence imaging relies upon a quasi-steady-state of magnetization in a subject being scanned by applying the SSFP pulse sequence at repetition times (TR) significantly shorter than the spin-lattice (T1) and the spin—spin (T2) relaxation times of hydrogen nuclei in the subject. The SSFP pulse sequence includes a series of RF excitation pulses wherein the pulses typically have the same constant phase increment. SSFP pulse sequences typically achieve high signal-to-noise ratios within short scan times. Images produced by SSFP pulse sequences are also typically very sensitive to motion.

With phase-cycled SSFP, multiple image volumes of the same region of anatomy may be acquired, each with its own steady-state phase-cycling scheme. Cycling the phase (i.e. incrementing the phase by a constant value at each TR) of the RF excitation pulse shifts the spectral frequency response, thus shifting the frequency at which the SSFP signal nulls (or "banding artifacts") occur. The resulting image volumes are combined to obtain an image of the anatomy with the desired characteristics. For example, to avoid SSFP banding artifacts, the image volumes may be combined using a maximum intensity projection across volumes or Fourier Transform across several volumes. There are also related techniques that use complex addition or subtraction to enhance contrast between water and fat.

To maintain a steady-state during data acquisition, the volumes are generally acquired sequentially. Interleaving data acquisition may be disruptive to the steady-state conditions created in each of the imaging volumes. Because of the sequential acquisitions, there is a high probability of subject motion causing mis-registration of the image volumes. Depending on the method used for combination of the image volumes, mis-registration may blur or obscure structures of interest altogether.

One proposed solution to address and, preferably, reduce motion induced artifacts is predicated upon a reverse centric phase encode acquisition for a first volume followed by a centric phase encode acquisition for a second volume. With a reverse centric phase encode acquisition, k-space is scanned in a spiral pattern such that the periphery of k-space is sampled first during the scan and the sampling continues or spirals inward to acquire the central views of k-space at or near the end of the scan. In contrast, with a centric phase encode acquisition, the center of k-space is sampled early in the scan and sampling continues in a spiraled fashion toward the periphery of k-space. Elliptic centric view order, however, is generally not practical for SSFP pulse sequence protocols.

The SSFP signal typically requires time on the order of three to five times the T1 value of the target tissue to come to a steady-state condition. For cerebrospinal fluid at 1.5T, twelve to twenty seconds is necessary for a steady-state condition to be achieved. Waiting as long as twenty seconds before imaging significantly increases scan time and negatively affects patient throughout. It is also generally well-known that oscillatory behavior is experienced as the signal in the target tissue decays to steady-state. Numerous schemes have been developed to reduce oscillatory behavior, but it has been shown that these schemes work well only for spins near the resonant frequency. Off-resonant spins still exhibit oscillatory behavior. As a result, since elliptic centric ordering acquires the center of k-space temporally first, image quality degradation is possible if the spins have not had sufficient time to decay to steady-state and still exhibit oscillatory signal fluctuations.

It would therefore be desirable to have a system and method capable of elliptic centric phase order acquisition with phase-cycled SSFP pulse sequences for multi-volume imaging that reduces oscillatory conditions as steady-state conditions are achieved.

BRIEF DESCRIPTION OF INVENTION

The present invention provides a system and method of MR data acquisition using a phase-cycled SSFP pulse sequence with a reverse elliptic centric view ordering acquisition followed by an elliptic centric view ordering acquisition for multiple volume imaging that overcomes the aforementioned drawbacks.

Multiple volumes of the anatomy of interest are imaged using a phase-cycle SSFP pulse sequence and a reverse elliptic centric view ordering is used to sample a first volume and an elliptic centric view ordering is used to sample a second volume. A series of dummy acquisitions are played out between imaging of the first and second volumes. The time to play out the dummy acquisitions is used to modulate the phase increment of the RF pulses of the SSFP pulse sequence for the first volume to the phase increment of the RF pulses of the SSFP pulse sequence for the second volume. Oscillations in signal are reduced as the second volume is brought to a steady-state by gradually ramping the RF pulse phase increment for acquisition from the first volume to the RF pulse phase increment for acquisition from the second volume.

Therefore, in accordance with one aspect, the present invention includes a method comprising the steps of applying at least one SSFP pulse sequence to acquire MR data for at least one volume of data for the anatomy of interest. The method further includes acquiring MR data for the at least one volume in an elliptic centric phase encode order.

In accordance with another aspect of the present invention, an imaging protocol is disclosed and configured to image a first and a second volume. The protocol includes a first SSFP pulse sequence configured to acquire MR data for a first volume in a reverse centric phase encode order and a second SSFP pulse sequence configured to acquire MR data for a second volume in a centric phase encode order. The protocol also includes a discarded acquisitions segment configured to be played out after the first SSFP pulse sequence and before the second SSFP pulse sequence.

According to another aspect, the present invention includes an MR apparatus having a magnetic resonance imaging (MRI) system having a plurality of gradient coils positioned about a bore of a magnet to impress a polarizing magnetic field and an RF transceiver system, and an RF switch controlled by a pulse module to transmit RF signals to an RF coil assembly to acquire MR images. The MR apparatus further includes a computer programmed to generate and cause application of a phase-cycled SSFP pulse sequence to acquire MR data for a first and a second volume and acquire k-space of the first volume in a reverse centric phase encode order. The computer is further programmed to acquire k-space of the second volume in a centric phase encode order.

In accordance with yet another aspect of the present invention, a computer readable storage medium is disclosed and has a computer program stored thereon, and representing a set of instructions that when executed by a computer causes the computer to cause application of a first SSFP pulse sequence to acquire data for a first volume, wherein RF pulses of the first SSFP pulse sequence have a first phase increment. The computer is also caused to acquire MR data of the first volume in a reverse centric phase encode order and cause application of a second SSFP pulse sequence to acquire data for a second volume, wherein RF pulses of the second SSFP pulse sequence have a second phase increment, the second phase increment being different than the first phase increment. The computer is also programmed to acquire MR data of the second volume in a centric phase encode order.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

A system is shown to acquire MR data using a phase-cycled SSFP pulse sequence with a reverse elliptic centric phase encode sampling to acquire k-space for a first volume followed by a elliptic centric phase encode sampling to acquire k-space for a second volume. Dummy and discarded acquisitions are played out between imaging of the first and second volumes.

Figure 1:
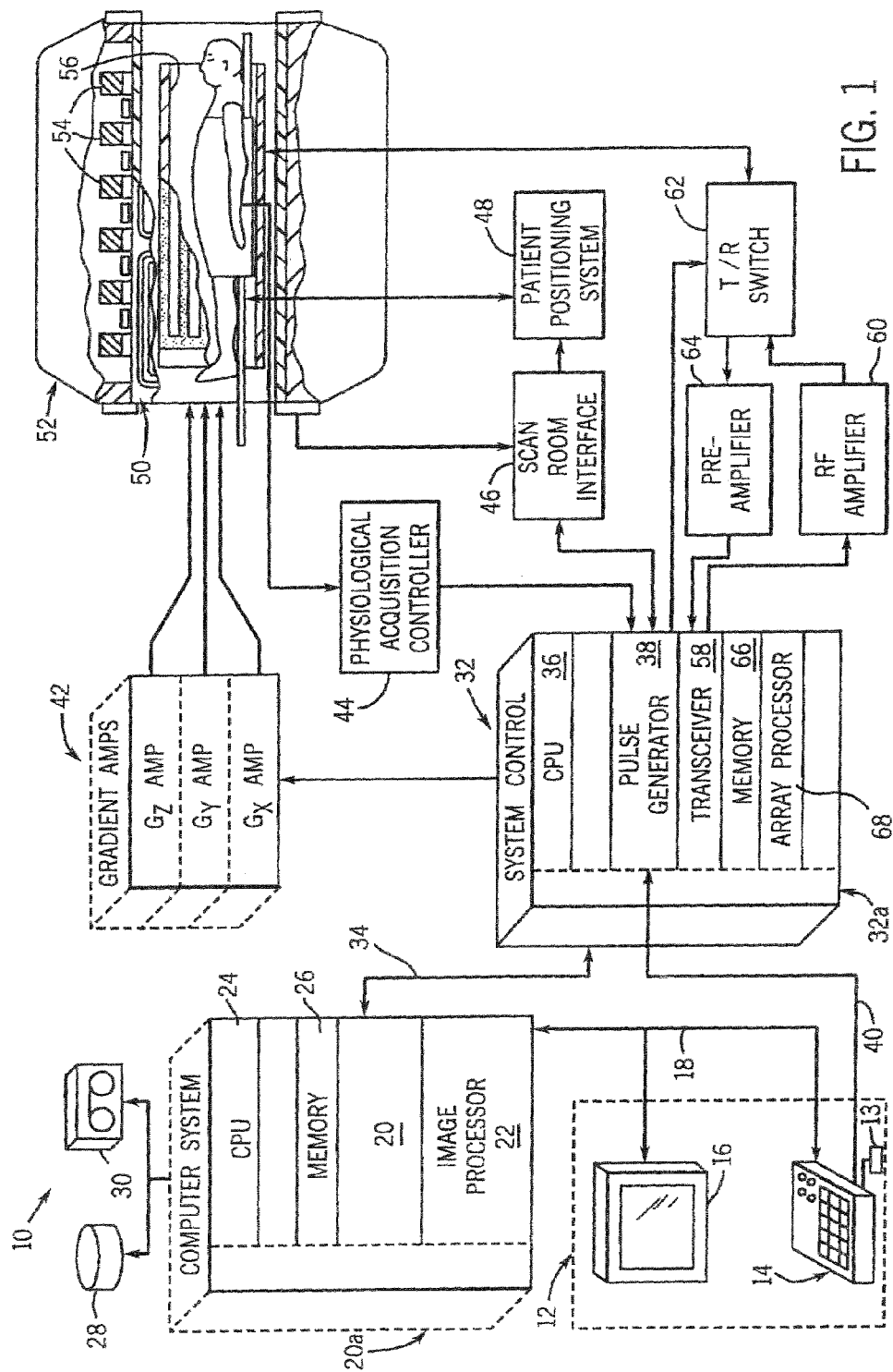
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
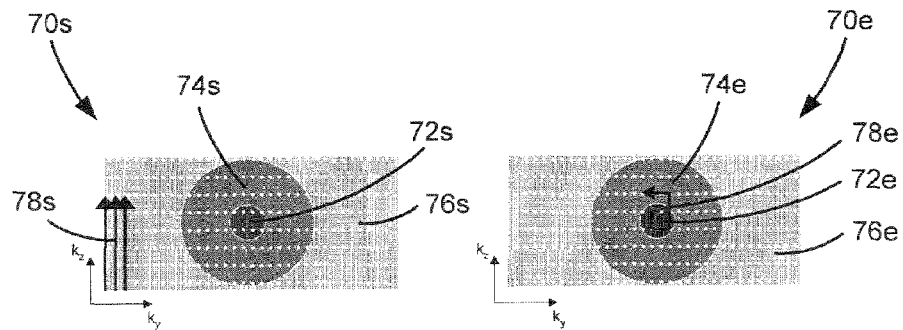
FIG. 2 is a schematic diagram of a sequential and an elliptic centric k-space view ordering scheme.

The present invention is directed to a reverse elliptic centric and an elliptic centric sampling of k-space, such as that described in U.S. Pat. No. 6,201,393 to Bernstein et al. In contrast to conventional sequential sampling of k-space, reverse elliptic centric and elliptic centric view ordering of k-space, samples the acquired MR signal such that k-space is filled in a spiraled fashion to and from the center of k-space, respectively. For example, shown in FIG. 2 are two k-space representations: a sequential k-space 70s and an elliptic centric k-space 70e. Each k-space includes a center of k-space 72s, 72e, an intermediate section of k-space 74s, 74e extending radially from the center of k-space 72s, 72e. The periphery of each k-space is defined at 76s and 76e, respectively.

As shown, in a sequential acquisition of k-space 70s, phase encode data is acquired in a linear manner 78s. Specifically, a row or column of k-space 70s is completely sampled before another row or column is sampled. In contrast, elliptic centric acquisition of k-space 70e first acquires the center of k-space 72e and spirals out (as shown by line 78e) to acquire the intermediate and periphery of k-space 74e and 76e, respectively. Reverse elliptic centric k-space acquisition acquires the periphery of k-space 76e and spirals inwardly (not shown) to acquire the intermediate and center of k-space 74e and 72e, respectively.

Figure 3:
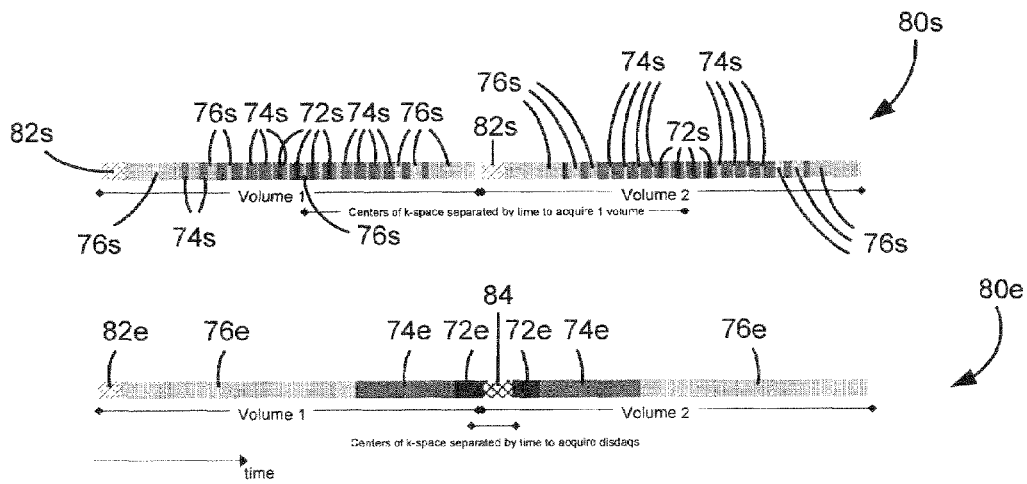
FIG. 3 illustrates timing diagrams for MR data acquisition for a sequential k-space sampling versus a reverse elliptic view and elliptic k-space sampling.

Referring now to FIG. 3, a pair of timing diagrams compares sequential acquisition of a pair of imaging volumes with a reverse elliptic centric and elliptic centric acquisition of a pair of imaging volumes. As shown in timing diagram 80s, periphery of k-space 76s is first acquired following a series of dummy acquisitions 82s. The dummy acquisitions are played out to allow spins of the nuclei in the first imaging volume to be brought to steady-state. As referenced in FIG. 2, sequential sampling of k-space corresponds to a row-by-row or column-by-column acquisition of k-space. As such, a number of rows (columns) that correspond to the periphery of k-space are first acquired with a sequential k-space acquisition 80s. As shown in diagram 80s, the center of k-space 72s is acquired intermittently. That is, after a portion of the center of k-space 72s is acquired for a particular row (column), peripheral regions of k-space 74s and 76s for the same row (column) and the next row (column) are acquired before data for another portion of the center of k-space is acquired. With the sequential acquisition of k-space, both imaging volumes are acquired in the same manner. In this regard, the centers of k-space of the imaging volumes are separated by the time experienced to acquire one volume.

On the other hand, with a reverse elliptic centric and elliptic centric view ordering or filling of k-space, the time experienced between the acquisitions of the centers of k-space is equal to the time to play out dummy or discarded acquisitions between imaging of the volumes. For example, still referring to FIG. 3, timing diagram 80e illustrates the timing of data acquisition for a pair of imaging volumes. As shown, the entirety of the periphery of k-space 76e is acquired of a first imaging volume after a series of discarded acquisitions 82e are played out to bring the first volume to steady-state. Once the periphery of k-space is acquired 76e, the entire intermediate portion of k-space 74e is acquired followed by sampling of the MR signal to fill the center of k-space 72e. In this regard, the first imaging volume is acquired with a reverse elliptic centric view ordering scheme.

The second imaging volume is acquired using an elliptic centric view ordering scheme and, as such, the center of k-space 72e is first acquired, then the intermediate portion of k-space 74e, and then the k-space periphery 76e is acquired. It should be noted that the second imaging volume is not imaged until a series of dummy or discarded acquisitions 84 are played out after the first imaging volume is imaged. As such, the time experienced between the acquisitions of the respective centers of k-space is equal to the time necessary to play out discarded acquisitions 84.

With phase-cycled SSFP imaging, the RF pulses of the SSFP pulse sequence have a phase increment different for imaging of the second volume than used to image the first volume. In essence, to image two volumes sequentially, a first SSFP pulse sequence is applied to image the first volume wherein the RF pulses have a first phase increment and a second SSFP pulse sequence is applied to image the second volume wherein the RF pulses have a second phase increment different from the first phase increment. In conventional phase-cycled imaging, the transition between phase-cycling occurs instantaneously. In accordance with the present invention, the transition in phase-cycling occurs gradually.

Figure 4:
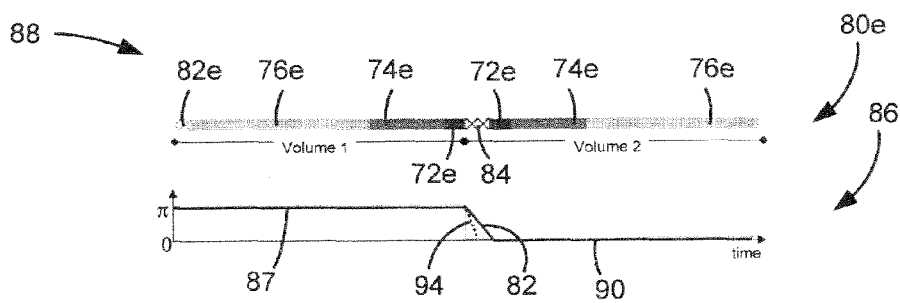
FIG. 4 is a schematic diagram of a phase-cycling SSFP pulse sequence imaging scheme with reverse elliptic centric phase encode order acquisition followed by an elliptic centric phase encode order acquisition in accordance with the present invention.

Referring now to FIG. 4, timing diagram 80e described with respect to FIG. 3 is shown relative to a phase-cycling scheme 86. In the illustrated example, the phase 87 of the RF pulses of the SSFP pulse sequence to image the first volume are incremented at each TR by Π radians. This phase increment is maintained throughout the entire reverse elliptic centric acquisition 88 of k-space. As described, with the reverse elliptic centric acquisition, the periphery of k-space 76e is acquired first and the center of k-space 72e is acquired last for the first imaging volume. After the first imaging volume is imaged and prior to the imaging of the second volume, a discarded acquisitions segment 84 is played out. After the discarded acquisitions segment 84, the second imaging volume is imaged using a SSFP pulse sequence wherein the RF pulses have a phase increment different from the phase increment of the RF pulses of the SSFP pulse sequence used to image the first volume. In the illustrated example, the RF pulses of the SSFP pulse sequence to acquire data from the second volume have a phase increment 90 set to zero. It is during the discarded acquisitions segment 84 that the transition from the first RF pulse phase increment to the second RF pulse phase increment occurs. The choice of RF phase increment is arbitrary, so long as the RF phase increment of the second imaging volume differs from the RF phase increment of the first imaging volume.

By ramping the transition during the discarded acquisitions segment 84, only a small change in the RF phase increment is introduced at each TR and the SSFP condition may be maintained. This ramping in phase increment is illustrated by solid slope-line 92. One skilled in the art will readily appreciate that the ramping may be shortened, as represented by dashed slope-line 94 such that some discarded or dummy acquisitions are acquired at the new RF pulse phase increment and the spins in the second volume may relax to the new steady-state condition. The ramping or modulating of the RF phase-cycling limits transient oscillatory signals that negatively affect image quality. Moreover, the transition between phase-cycling schemes need not be purely linear as illustrated in FIG. 4. The time for transition between phase-cycling at each TR should not be too large to induce oscillatory signal behavior.

Figure 5:
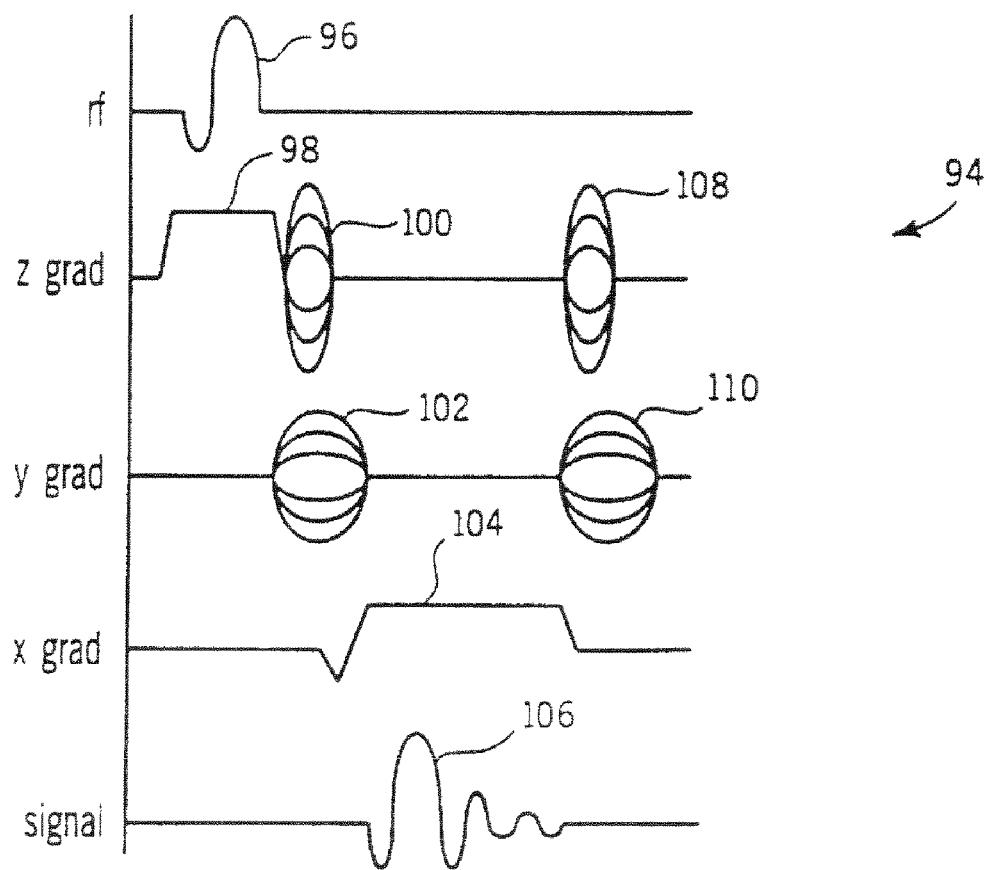
FIG. 5 is a graphic illustration of a SSFP pulse sequence.

Referring now to FIG. 5, a SSFP pulse sequence 94 is graphically shown. Pulse sequence 94 includes an RF excitation pulse 96 that is produced in the presence of a slice select gradient pulse 98 to produce transverse magnetization in a 3D volume. A phase encoding gradient pulse 100 follows the slice select gradient pulse 98 and is directed along a z-axis and a phase encoding gradient pulse 102 is directed along a y-axis. A readout or frequency encoding pulse 104 is directed along an x-axis whereupon an MR signal 106 is acquired and processed in accordance with well-known imaging techniques. To shorten scan times, a partial echo may be sampled. After the acquisition, rewinder gradient pulses 108 and 110 are applied to rephrase the magnetization before the pulse sequence is reapplied. If a full echo is sampled, a rewinder gradient pulse in the frequency encoding direction may be applied as well. As is well known, the pulse sequence is repeated until k-space for an imaging volume is acquired. For phase-cycled SSFP imaging in accordance with the present invention, the phase increment of the RF pulse is ramped each TR so that the phase increment of the RF pulses of the SSFP pulse sequence to image a second volume is different from the phase increment of the RF pulses used to image a first volume.

The present invention is directed to a multi-volume imaging protocol that uses a phase-cycled SSFP pulse sequence to acquire MR data from each volume. Discarded acquisition or dummy acquisitions are played out between acquisition of the volumes. Since the center of k-space contains most of the information contributing to image signal, the present invention includes an imaging protocol that uses different k-space view ordering of the MR acquisition to acquire the center of k-space for each of two volumes within close temporal proximity. Application of this protocol reduces the likelihood of gross mis-registration in the two volumes. Specifically, the protocol is directed to the application of phase-cycled SSFP pulse sequences with a reverse elliptic centric view ordering of k-space for a first volume and an elliptic centric view ordering of k-space for the second volume. Thus, in the slice and phase encoding directions, data acquisition spirals into the center of k-space for the first volume dataset and spirals out from the center of k-space for the second volume dataset. The time between acquisition of the centers of k-space is separated by the time required to apply dummy repetitions to bring the second volume to a steady-state condition.

The present imaging protocol utilizes the steady-state condition from the first acquired volume to make a smooth, non-oscillatory transition to the new steady-state condition for the second image volume that is acquired with an elliptic centric view ordering. In this regard, the protocol purposely disrupts steady-state conditions of the anatomy of interest after acquisition of the first volume to reduce oscillatory transient signals in the second volume. Gradual modulation of the RF phase-cycling scheme minimally affects the steady-state condition such that imaging may take place while the modulation is carried out. With the present invention, modulation of the RF phase-cycling scheme is applied during the dummy repetitions between imaging of the volumes. Easing the transition between phase-cycling schemes with RF phase modulation reduces, if not eliminates, oscillations in the MR signal. Additional time for the discarded acquisitions after the transition to the new phase-cycling scheme is preferred to allow the MR signal to come to a new steady-state. Oscillatory behavior is not observed in resonance or off-resonance spins during this transition time.

The above-described imaging protocol and the associated pulse sequences may be embodied in a computer program representing a set of instructions executable by one or more computers/processors of an MR imaging system such as that shown in FIG. 1. The computer program may also take the form a computer data signal embodied in a carrier wave that is uploadable/downloadable to an MR imaging system such as that shown in FIG. 1.

Phase-cycled SSFP pulse imaging in accordance with the present invention is less susceptible to motion induced artifacts and, as such, the imaging sequence is less likely to provide non-diagnostically valuable images thereby reducing the need for reacquiring data and/or requiring multiple exams of the subject. An imaging protocol in accordance with the present invention may also increase the subject population which can be studied with phase-cycled SSFP imaging. Certain patient populations, such as children, are prone to motion during MRI exams and, as such, are not good candidates for study with known phase-cycled SSFP imaging protocols. The present invention may make imaging of these subjects more feasible. Additionally, current imaging techniques are capable of obtaining diagnostic quality images with much higher spatial resolution than is used clinically. Lower resolution clinical protocols are used because of the increased sensitivity to motion of higher resolution imaging. As such, decreasing sensitivity to motion with the present invention may allow for more reliable use of higher resolution imaging protocols.

Therefore, in accordance with one embodiment, the present invention includes a method comprising the steps of applying at least one SSFP pulse sequence to acquire MR data from at least one volume. The method further includes acquiring MR data from the at least one volume in an elliptic centric phase encode order.

In accordance with another embodiment of the present invention, an imaging protocol is disclosed and configured to image a first and a second volume. The protocol includes a first SSFP pulse sequence configured to acquire MR data for a first volume in a reverse centric phase encode order and a second SSFP pulse sequence configured to acquire MR data for a second volume in a centric phase encode order. The protocol also includes a discarded acquisitions segment configured to be played out after the first SSFP pulse sequence and before the second SSFP pulse sequence.

According to another embodiment, the present invention includes an MR apparatus having a magnetic resonance imaging (MRI) system having a plurality of gradient coils positioned about a bore of a magnet to impress a polarizing magnetic field and an RF transceiver system, and an RF switch controlled by a pulse module to transmit RF signals to an RF coil assembly to acquire MR images. The MR apparatus further includes a computer programmed to generate and cause application of a phase-cycled SSFP pulse sequence to acquire MR data for a first and a second volume and acquire k-space of the first volume in a reverse centric phase encode order. The computer is further programmed to acquire k-space of the second volume in a centric phase encode order.

In accordance with yet another embodiment of the present invention, a computer readable storage medium is disclosed and has a computer program stored thereon, and representing a set of instructions that when executed by a computer causes the computer to cause application of a first SSFP pulse sequence to acquire data for a first volume, wherein RF pulses of the first SSFP pulse sequence have a first phase increment. The computer is also caused to acquire MR data of the first volume in a reverse centric phase encode order and cause application of a second SSFP pulse sequence to acquire data for a second volume, wherein RF pulses of the second SSFP pulse sequence have a second phase increment, the second phase increment being different than the first phase increment. The computer is also programmed to acquire MR data of the second volume in a centric phase encode order.

The present invention has been described in terms of the preferred embodiment, and it is recognized that equivalents, alternatives, and modifications, aside from those expressly stated, are possible and within the scope of the appending claims.

What is claimed is:

1. A method comprising the steps of:
applying a first SSFP pulse sequence to acquire MR data for a first volume of data for an anatomy of interest;
applying a second SSFP pulse sequence to acquire MR data for a second volume of data for the anatomy of interest;
acquiring MR data for the first volume in a reverse elliptic centric phase encode order; and
acquiring MR data for the second volume in an elliptic centric phase encode order.

2. The method of claim 1 further comprising the step of purposely disrupting steady-state conditions of a first volume after acquisition of the first volume to reduce oscillatory transient signals in a second volume.

3. The method of claim 1 wherein a phase increment of RF pulses at each TR of the first SSFP pulse sequence differs from that of RF pulses of the second SSFP pulse sequence.

4. The method of claim 3 further comprising the step of changing the phase increment of the RF pulses of the first SSFP pulse sequence to the phase increment of the RF pulses of the second SSFP pulse sequence after MR data acquisition of the first volume.

5. The method of claim 4 further comprising the step of playing out one or more dummy acquisitions between acquisition of the first and the second volumes.

6. The method of claim 5 further comprising the step of modulating the RF phase increment every TR during the one or more dummy acquisitions to reduce pre-steady state oscillations in MR signals from spins in the second volume.

7. The method of claim 6 wherein the step of modulating includes the step of non-instantaneously transitioning the phase increment of the RF pulses of the first SSFP pulse sequence to the phase increment of the RF pulses of the second SSFP pulse sequence between acquisition of the first and the second volumes.

8. The method of claim 7 wherein the step of non-instantaneously transitioning includes the step of gradually ramping the phase increment of the RF pulses of the first SSFP pulse sequence to the phase increment of the RF pulses of the second SSFP pulse sequence.

9. The method of claim 8 wherein the transition between the phase increment of the RF pulses of the first SSFP pulse sequence and the phase increment of the RF pulses of the second SSFP pulse sequence is linear.

10. An MR apparatus comprising:
a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
a computer programmed to;
generate and cause application of a phase-cycled SSFP pulse sequence to acquire MR data for a first and a second volume of data for the anatomy of interest;
acquire k-space of the first volume in a reverse centric phase encode order; and
acquire k-space of the second volume in a centric phase encode order.

11. The MR apparatus of claim 10 wherein the computer is further programmed to play out a series of discarded acquisitions after acquisition of k-space for the first volume.

12. The MR apparatus of claim 11 wherein the phase-cycled SSFP pulse sequence includes a series of RF pulses that have a first phase increment for data acquisition of the first volume and a second phase increment for data acquisition of the second volume.

13. The MR apparatus of claim 12 wherein the computer is further programmed to adjust the first phase increment to the second phase increment while the series of discarded applications are played out.

14. The MR apparatus of claim 13 wherein the computer is further programmed to ramp down the first phase increment to the second phase increment at a temporal rate that does not cause oscillations in MR detectable signals of the second volume as the second volume is brought to a steady-state.

15. The MR apparatus of claim 14 wherein the temporal rate is sufficient to prevent oscillations in MR signals detectable from off-resonance spins of nuclei in the second volume.

16. The MR apparatus of claim 14 wherein the computer is further programmed to acquire a center of k-space for the first volume in close temporal proximity to a center of k-space for the second volume.

17. A computer readable storage medium having a computer program stored thereon and representing a set of instructions that when executed by a computer causes the computer to:
cause application of a first SSFP pulse sequence to acquire data for a first volume, wherein RF pulses of the first SSFP pulse sequence have a first phase increment;
acquire MR data for the first volume in a reverse centric phase encode order;
cause application of a second SSFP pulse sequence to acquire data for a second volume, wherein RF pulses of the second SSFP pulse sequence have a second phase increment, the second phase increment being different than the first phase increment; and
acquire MR data for the second volume in a centric phase encode order.

18. The computer readable storage medium of claim 17 wherein the set of instructions further causes the computer to play out a series of dummy RF pulses prior to application of the second SSFP pulse sequence.

19. The computer readable storage medium of claim 18 wherein the set of instructions further causes the computer to cause a change-over from the first phase increment to the second phase increment while the dummy RF pulses are played out.

20. The computer readable storage medium of claim 17 wherein the set of instructions further causes the computer to purposely disrupt a steady-state of spins in the anatomy of interest to reduce oscillation of spins in the second volume as the anatomy of interest is brought to a new steady-state.

21. The computer readable storage medium of claim 17 incorporated in a computer data signal embodied in a carrier wave that is uploadable/downloadable to an MR imaging system that when executed by a computer causes execution of the set of instructions.

22. An imaging protocol to image a first and a second volume, the protocol comprising:
a first SSFP pulse sequence configured to acquire MR data for a first volume in a reverse centric phase encode order; and
a second SSFP pulse sequence configured to acquire MR data for a second volume in a centric phase encode order.

23. The imaging protocol of claim 22 further comprising a discarded acquisitions segment configured to be played out after the first SSFP pulse sequence and before the second SSFP pulse sequence.

24. The imaging protocol of claim 23 wherein RF pulses of the first SSFP pulse sequence have a first phase increment different from a second phase increment of RE pulses of the second SSFP pulse sequence.

25. The imaging protocol of claim 24 wherein the discarded acquisitions segment has a temporal length sufficient to allow ramping of the first phase increment to the second phase increment.

26. The imaging protocol of claim 25 wherein the first phase increment and the second phase increment are linearly related.

27. The imaging protocol of claim 22 wherein a center of k-space for the first volume is acquired in close temporal proximity to a center of k-space for the second volume.

28. A method comprising the steps of:
applying at least one SSFP pulse sequence to acquire MR data for at least one volume of data for an anatomy of interest;
acquiring MR data for the at least one volume in an elliptic centric phase encode order; and
purposely disrupting steady-state conditions of a first volume after acquisition of the first volume to reduce oscillatory transient signals in a second volume.

29. The method of claim 28 further comprising the step of imaging the first volume before imaging the second volume.

30. The method of claim 28 configured for at least one of internal auditory imaging, cervical spine or cartilage imaging.

31. The method of claim 28 configured to reduce transient oscillatory signals from resonance and off-resonance spins.

* * * * *

UNITED STATES PATENT AND TRADEMARK OFFICE
CERTIFICATE OF CORRECTION

| | | |
|---|---|---|
| PATENT NO. | : 7,012,428 B1 | Page 1 of 1 |
| APPLICATION NO. | : 10/707483 | |
| DATED | : March 14, 2006 | |
| INVENTOR(S) | : Ward et al. | |

It is certified that error appears in the above-identified patent and that said Letters Patent is hereby corrected as shown below:

Col. 12, line 11 (Claim 24), delete "RE" and substitute therefore -- RF --.

Signed and Sealed this

Eighteenth Day of July, 2006

JON W. DUDAS
*Director of the United States Patent and Trademark Office*